United States Patent [19]

Shimizu et al.

[11] Patent Number: 4,990,428

[45] Date of Patent: Feb. 5, 1991

[54] PHOTOSENSITIVE PLANOGRAPHIC PRINTING PLATE

[75] Inventors: Shigeki Shimizu, Atsugi; Hiroshi Ide, Sagamihara, both of Japan

[73] Assignee: Mitsubishi Kasei Corporation, Tokyo, Japan

[21] Appl. No.: 492,255

[22] Filed: Mar. 12, 1990

Related U.S. Application Data

[63] Continuation-in-part of Ser. No. 275,602, Nov. 23, 1988, abandoned, which is a continuation of Ser. No. 39,784, Apr. 20, 1987, abandoned, which is a continuation of Ser. No. 784,097, Oct. 4, 1985, abandoned.

[30] Foreign Application Priority Data

Oct. 23, 1984 [JP] Japan .................................. 59-222811

[51] Int. Cl.$^5$ .............................................. G03C 1/492
[52] U.S. Cl. ...................................... 430/276; 430/278; 430/281; 430/285; 430/277; 430/910
[58] Field of Search ............... 430/275, 276, 278, 281, 430/285, 277, 910

[56] References Cited

U.S. PATENT DOCUMENTS

| | | | |
|---|---|---|---|
| 3,511,661 | 5/1970 | Rauner et al. | 96/86 |
| 4,116,695 | 9/1978 | Mori et al. | 430/278 |
| 4,511,645 | 4/1985 | Koike et al. | 430/278 |
| 4,517,281 | 5/1985 | Briney et al. | 430/277 |
| 4,537,855 | 8/1985 | Ide | 430/285 |
| 4,554,216 | 11/1985 | Mohr | 430/278 |

Primary Examiner—Jack P. Brammer
Attorney, Agent, or Firm—Oblon, Spivak, McClelland, Maier & Neustadt

[57] ABSTRACT

A photosensitive planographic printing plate comprises an aluminum or aluminum alloy plate having an anodic oxidation layer obtained by the anode oxidation in an electrolyte of phosphoric acid or in an electrolyte of mixed acid but containing the phosphoric acid as a main component, and a layer of photopolymerizable photosensitive composition overlaid on the Al or Al alloy plate and containing a polymer binder having a carboxylic acid residue or carboxylic acid anhydride residue, an addition polymerizable unsaturated compound and a photopolymerization initiator.

3 Claims, No Drawings

PHOTOSENSITIVE PLANOGRAPHIC PRINTING PLATE

This application is a Continuation-In-Part Division of application Ser. No. 07/275,602, filed on Nov. 23, 1988, now abandoned. Which is a continuation of abandoned application Ser. No. 07/039,784 filed Apr. 20, 1987, which a continuation of Abandoned application Ser. No. 06/784,097 filed Oct. 4, 1985. Oct. 23, 1984

Field of the Invention

This invention relates to a photosensitive planographic printing plate. More particularly, it relates to a highly photosensitive photopolymerizable planographic printing plate which can be developed with a solution containing mainly an alkaline substance.

[Background of the invention]

In the printing industry, the photosensitive planographic printing plate, e.g., an offset PS plate is now widespread, for instance, for commercial printing, news printing, form printing and carton printing, because of the simplicity of handling thereof and the elimination of labor in the process for producing a press plate and in printing comparing with a conventional wipe-on plate.

Recently, new process systems and automation systems for producing the planographic printing plate are proposed to meet the demand of further elimination of labor or high-speed processing, and so the photosensitive planographic printing plate which is highly sensitive and applicable to such new systems is strongly desired. Hitherto, for instance, the photosensitive planographic printing plate had been exposed by closely contacted with an original image-bearing film and irradiated with an actinic light to form an image pattern on the surface thereof. However, recently a new exposing system wherein the original image of micro film is enlarged and projected directly onto the surface of the photosensitive planographic printing plate to form the image is developed and made into practice. This new system is advantageous in comparison with the conventional process in view of the saving of silver film and the automatization of step and repeat exposure. Another new system wherein the photosensitive layer of the sensitized planographic printing plate is directly exposed by a scanning of visible ray of laser such as argon ion laser or ultra violet ray to form the image is also developed. Such laser scanning exposing system is very favorable, because the system saves much more labor due to no necessity to make the silver film and because the working of producing the original image will be increasingly computerized and much of original image will be expected to be directly produced as a signal from a computer.

To form the image pattern effectively by those new exposing systems, the photosensitive planographic printing plate is required with extremely high exposing speed comparing with the conventional.

Moreover, with respect to the development it is desirable that such photosensitive planographic printing plate can be developed in an aqueous alkaline solution, because the aqueous solution developer is more advantageous than the organic solvent developer in view of the safety or sanitation of the working circumstance and the developing cost.

Therefore, the object of this invention is to provide a photosensitive planographic printing plate having an extremely high exposing speed so as to be applicable to the above mentioned new exposing systems, and excellent in printing endurance and printability, and in addition capable of being developed in the aqueous alkaline solution.

For producing a highly sensitive planographic printing plate, the following conditions must be fully satisfied. (1)Firstly, the photosensitive composition which undergoes a chain photoreaction causing an amplification effect must be used, instead of the conventional photosensitive composition of photo-single-reaction type such as a diazo composition, e.g., a condensation product of para-diazo-diphenylamine and formaldehyde, or a photodimerizable photosensitive resin having β-phenyl acrylate group on a main or side chain. (2)Secondly, the coating layer in the imaged area obtained by the photohardening can adhere strongly to the aluminium grained plate for ensuring the excellent printing endurance. (3)Thirdly, the photosensitive composition in the unexposed or non-imaged area can be dissolved fully by the developer and removed completely, and the bare surface of the aluminium grained plate is hardly stained with a printing ink or easily cleanable in case of stained, and has an excellent hydrophilic property resulting in the excellent printability.

SUMMARY OF THE INVENTION

The inventors have done many investigations to get a highly sensitive planographic printing plate to meet the above mentioned conditions, and have found that the high sensitivity may be obtained by forming the photosensitive layer with a composition of photopolymeric reaction type and that when the photosensitive planographic printing plate is constituted with an aluminium grained plate as a substrate, which is anodically oxidized in an electrolytic solution of phosphoric acid or in an electrolytic solution containing mainly the phosphoric acid, and with the photopolymerizable photosensitive composition, coated on the metal plate, containing (co)polymer having carboxylic acid (anhydride) residue, the imaged area of the coated layer after the development strongly adheres to the aluminium metal plate and, on the other hand, the non-imaged area of the coated layer is advantageously hydrophilic and water-retentive resulting in the favorable printability.

Based on the above findings, in accordance with the present invention, provided is a photosensitive planographic printing plate comprising an aluminium or aluminium alloy plate with an anodic oxidation layer obtained by anode oxidation in an electrolyte of phosphoric acid or in an electrolyte containing the phosphoric acid as a main component, and a layer of photopolymerizable photosensitive composition overlaid on the aluminium or aluminium alloy plate and containing a polymer having a carboxylic acid residue or carboxylic acid anhydride residue, an addition polymerizable unsaturated compound and a photopolymerization initiator.

DETAILED DESCRIPTION OF THE INVENTION

The photopolymerizable photosensitive composition of the invention contains as main components the polymer having the carboxylic acid residue or carboxylic acid anhydride residue, the addition polymerizable unsaturated compound and the photopolymerization initiator.

The polymer having the carboxylic acid residue or carboxylic acid anhydride residue, which works as a binder of the composition, is an essential component to improve the developability, image reproducibility, printing endurance and ink adhesion, etc.

According to the invention, the polymer binder above includes, for instance, polymers constituted by the units of the following formulae I to IV

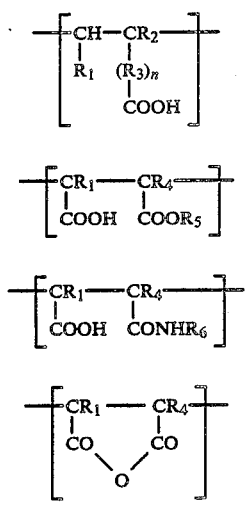

$$\left[\begin{array}{c}-CH-CR_2-\\ \phantom{-}| \phantom{-----}|\\ R_1 \phantom{--}(R_3)_n\\ \phantom{-------}|\\ \phantom{------}COOH\end{array}\right] \quad \text{I}$$

$$\left[\begin{array}{c}-CR_1--CR_4-\\ \phantom{-}| \phantom{-----}|\\ COOH \phantom{-}COOR_5\end{array}\right] \quad \text{II}$$

$$\left[\begin{array}{c}-CR_1--CR_4-\\ \phantom{-}| \phantom{-----}|\\ COOH \phantom{-}CONHR_6\end{array}\right] \quad \text{III}$$

$$\left[\begin{array}{c}-CR_1--CR_4-\\ \phantom{-}| \phantom{-----}|\\ CO \phantom{----}CO\\ \phantom{--}\backslash\phantom{--}/\\ \phantom{----}O\end{array}\right] \quad \text{IV}$$

wherein $R_1$ and $R_4$ represent hydrogen atom or alkyl group such as alkyl group containing 1 to 8 carbon atoms; $R_2$ represents hydrogen atom, methyl group, alkylcarbamoyl group such as propylcarbamoyl, hexylcarbamoyl and nonylcarbamoyl group, or arylcarbamoyl group such as phenylcarbamoyl, p-hydroxyphenylcarbamoyl and benzylcarbamoyl group; $R_3$ represents alkylene group containing 1 to 7 carbon atoms, optionally substituted with phenylene or hydroxyl group, such as hydroxymethylene, methylene, ethylene, butylene and heptylene group; R represents hydrogen atom, alkyl group optionally substituted with hydroxyl, acryloyl, methacryloyl and phenyl group, such as hydroxyethyl, acryloxyethyl and benzyl group, aryl group optionally substituted with hydroxyl or alkyl group, such as phenyl, p-hydroxyphenyl and toluyl group, or cycloalkyl group such as cyclohexyl and cyclopentyl group; $R_6$ represents alkyl group optionally substituted with hydroxyl or phenyl group, such as amyl, dodecyl, hydroxyethyl and benzyl group, allyl group, or aryl group optionally substituted with hydroxyl or alkyl group, such as phenyl, p-hydroxyphenyl and toluyl group, or cycloalkyl group such as cyclohexyl and cyclopentyl group; and n represents an integer of 0 or 1. Besides, a polymer constituted by units derived from itaconic acid, semi-ester thereof or anhydride thereof, an acidic cellulosic derivative, an acidic polyvinylalcohol and the like may be used as the polymer binder as well.

Examples of the compound constituting the unit represented by the formula I are acrylic acid, methacrylic acid, crotonic acid, itaconanilic acid, oleic acid, vinylacetic acid, vinylglycolic acid, vinylbenzoic acid, etc.

Examples of the compound constituting the unit represented by the formula II are maleic acid, monoalkyl maleate, monohydroxyalkyl maleate, monoacryloxyethyl maleate, monobenzyl maleate, monophenoxyethyl maleate, monophenyl maleate, monocyclohexyl maleate, fumaric acid or semi-ester thereof, citraconic acid or semi-ester thereof, etc.

Examples of the compound constituting the unit represented by the formula III are maleic acid monoalkylamide, maleic acid monohydroxyalklamide, maleic acid monobenzylamide, maleic acid monophenylamide, citraconic acid monoalkylamide citraconic acid monophenylamide, etc.

Examples of the compound constituting the unit represented by the formula IV are maleic acid anhydride, citraconic acid anhydride, etc.

Examples of itaconic acid, semi-ester or anhydride thereof are itaconic acid, monoalkyl itaconate, monobenzyl itaconate, monophenoxyethyl itaconate, monophenyl itaconate, monocyclohexyl itaconate, itaconic acid monoalkylamide, itaconic acid anhydride, etc.

Examples of acidic cellulosic derivative are cellulose acetate phthalate, hydroxypropylmethylcellulose phthalate, hydroxypropylmethylcellulose hexahydrophthalate, etc.

Examples of acidic polyvinyl alcohol are vinyl alcohol/vinyl phthalate copolymer, vinyl acetate/vinyl alcohol/vinyl phthalate copolymer, etc.

The polymer having the carboxylic acid residue or carboxylic acid anhydride residue may be prepared by polymerization of the compound constituting each desired unit hereinbefore mentioned, or copolymerization of the compound with other compound such as styrene in a known manner.

Generally, the polymer binder having the average molecular weight of 1,000 to 100,000, preferably, 3,000 to 70,000 is used in accordance with the invention.

The addition polymerizable unsaturated compound of the invention is a monomer having a ethylenically unsaturated double bond, which undergoes a three-dimensional addition polymerization initiated and accelerated by the production of the photodegradation product of the photopolymerization initiator when the photopolymerizable photosensitive composition is exposed to irradiation by active rays. After the addition polymerization, the ethylenically unsaturated compound is cured and made substantially insoluble.

The term of "monomer" herein described, is meant in contrast to the term of high molecular polymer and it includes dimer, trimer and oligomer in addition to the monomer in a narrow sense.

Examples of the monomer having the ethylenically unsaturated double bond include unsaturated carboxylic acid, ester of unsaturated carboxylic acid with aliphatic polyhydroxy compound, ester of unsaturated carboxylic acid with aromatic polyhydroxy compound, ester obtained by an esterification of unsaturated carboxylic acid and polyvalent carboxylic acid with polyhydroxy compound such as aliphatic polyhydroxy compound or aromatic polyhydroxy compound mentioned above.

Examples of unsaturated carboxylic acid include acrylic acid, methacrylic acid, itaconic acid crotonic acid, maleic acid and the like.

Examples of aliphatic polyhydroxy compound include divalent alcohols such as ethylene glycol, diethylene glycol, triethylene glycol, tetraethylene glycol, neopentyl glycol, propylene glycol and 1,2-butane diol, trivalent alcohols such as trimethylolethane, trimethylolpropane and glycerol, tetra- or polyvalent alcohols such as pentaerythritol and tripentaerythritol, and polyvalent hydroxycarboxylic acid such as dihydroxymaleic acid.

Examples of aromatic polyhydroxy compound include hydroquinone, resorcin, catechol, pyrogallol and the like.

Examples of polyvalent carboxylic acid include phthalic acid, isophthalic acid, terephthalic acid, tetrachlorophthalic acid, trimellitic acid, pyromellitic acid, benzophenonedicarboxylic acid, maleic acid, fumaric acid, malonic acid, glutaric acid, adipic acid, sebacic acid, tetrahydrophthalic acid and the like.

Examples of ester of aliphatic polyhydroxy compound with unsaturated carboxylic acid include acrylate such as ethylene glycol diacrylate, triethylene glycol diacrylate, tetramethylene glycol diacrylate, trimethylolpropane triacrylate, trimethylolethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, tripentaerythritol octaacrylate and glycerol diacrylate; methacrylate such as triethylene glycol dimethacrylate, tetramethylene glycol dimethacrylate, trimethylolpropane trimethacrylate, trimethylolethane trimethacrylate, pentaerythritol dimethacrylate, pentaerythritol trimethacrylate, pentaerythritol tetramethacrylate, dipentaerythritol dimethacrylate, dipentaerythritol trimethacrylate, dipentaerythritol tetramethacrylate, tripentaerythritol octamethacrylate, ethylene glycol dimethacrylate, 1,2-butanediol dimethacrylate and sorbitol tetramethacrylate; itaconate such as ethylene glycol diitaconate, propylene glycol diitaconate, 1,2-butanediol diitaconate, tetramethylene glycol diitaconate and pentaerythritol triitaconate; crotonate such as ethylene glycol dicrotonate, diethylene glycol dicrotonate and pentaerythritol tetracrotonate; and maleate such as ethylene glycol dimaleate, triethyleneglycol dimaleate and pentaerythritol dimaleate.

Examples of ester of aromatic polyhydroxy compound with unsaturated carboxylic acid include hydroquinone diacrylate, hydroquinone dimethacrylate, resorcin diacrylate, resorcin dimethacrylate, pyrogallol triacrylate and the like.

The representative esters obtainable by the esterification reaction among unsaturated carboxylic acid, polyvalent carboxylic acid and polyhydroxy compound, which are not always a single substance are shown in Table 1 wherein Z is an acryloyl or methacryloyl group.

TABLE 1

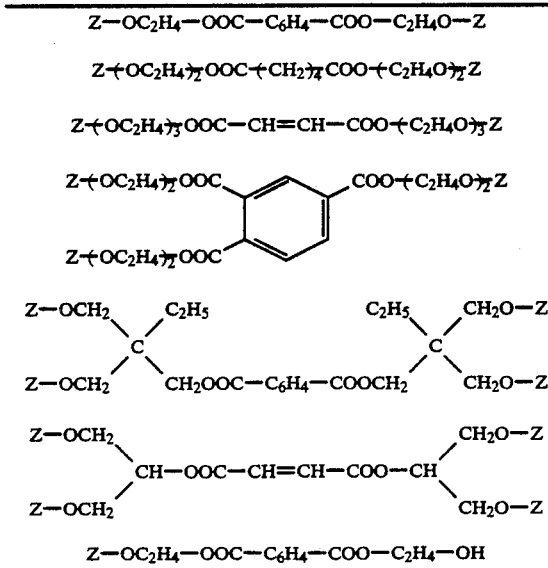

TABLE 1-continued

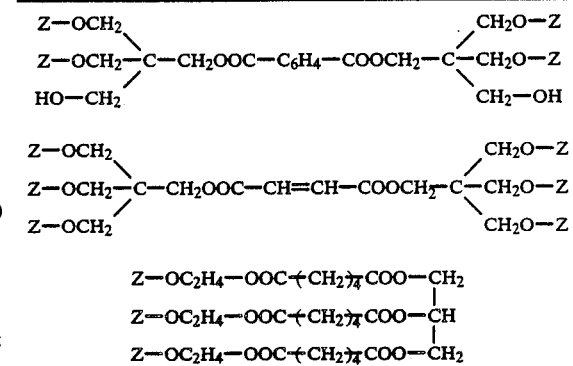

The other examples of the compounds having ethylenically unsaturated double bond in accordance with the present invention include acrylamide such as acrylamide, ethylene-bis-acrylamide and hexamethylene-bis-acrylamide; methacrylamide such as ethylene-bis-methacrylamide and hexamethylene-bis-methacrylamide; allyl ester such as diallyl phthalate, diallyl malonate, diallyl fumarate and triallyl isocyanurate; and a compound having vinyl group, such as divinyl adipate, divinyl phthalate and ethylene glycol divinyl ether.

Among the above ethylenically unsaturated compounds, trimethylolpropane triacrylate, trimethylolethane triacrylate and pentaerythritol tetraacrylate are especially preferable, because they are considerably highly sensitive and do not lower the ink adhesion in the photohardened image area.

The conventional photopolymerization initiators may be applicable to this invention. For example any one of benzoin, benzoinalkyl ether, benzophenone, anthraquinone, benzyl, Michler's ketone and the combination of biimidazole and Michler's ketone can be preferably used. The combination of biimidazole/dialkylaminostyryl derivative, S-triazine/cyanine dye derivative, and S-triazine/thiapyrylium derivative, etc. are preferably used so that the photosensitive composition is efficiently exposed to the visible light of argon ion laser.

The proportion of each component constituting the photosensitive composition of the invention is 10 to 80, preferably 20 to 60 % by weight of the polymer having the carboxylic acid residue or carboxylic acid anhydride residue, 90 to 20, preferably 80 to 40 % by weight of addition polymerizable unsaturated compound and 0.1 to 20, preferably 1 to 10 % by weight of photopolymerization initiator.

The photopolymerizable composition of the invention may be added and mixed with other components to improve or control the physical or chemical properties thereof, if necessary. Up to 20 % by weight of the sum of the three essential components, for example, thermalpolymerization inhibitor, antioxidant, coloring agent, plasticizer, auxiliary agent for coating can be added to the composition.

The photosensitive planographic printing plate of the invention may be produced by subjecting the aluminum or aluminum alloy plate to the anode oxidation in the electrolyte of phosphoric acid or in the electrolyte of mixed acid but mainly containing the phosphoric acid to form the layer of anodic oxidation on the surface of Al or Al alloy plate, followed by coating the photopolymerizable photosensitive composition.

Hitherto, it was known that the anodic oxidation layer contributed to the improvement of the surface hardness of the aluminum grained plate and to the improvement of the adhesion between the imaged area and the aluminum substrate plate. The inventors, however, have found that the printability, developability and others of the planographic printing plate is greatly governed by the anodic oxidation treatment when the photopolymerizable photosensitive composition of the invention is applied, different from the case of so-called diazo-type photosensitive composition which is widely used. That is, in case of diazo-type photosensitive composition, the aluminum plate treated by the anodic oxidation in any electrolyte, such as sulfuric acid or phosphoric acid, can provide an excellent developability or printability, but in case of the photopolymerizable photosensitive composition containing the polymer having the carboxylic acid residue or carboxylic acid anhydride residue, the aluminum plate treated by the anodic oxidation only in the phosphoric acid or in the electrolyte containing the phosphoric acid as the main component can specifically improve the sensitivity, developability, printability and printing endurance.

Accordingly, the aluminum or aluminum alloy plate according to this invention is treated by the anodic oxidation in the electrolytic solution containing 10 to 50 % by weight, preferably 20 to 40 % by weight of phosphoric acid and optionally containing up to 25 % by weight, preferably up to 10 % by weight of other acids such as sulfuric acid, oxalic acid and the like at a temperature of 10° to 50° C., preferably 25° to 45° C. with the current density of 0.2 to 10 $A/dm^2$, preferably 1 to 7 $A/dm^2$ for 10 seconds to 10 minutes, preferably 20 seconds to 3 minutes.

The anodic oxidation layer obtained under the conditions above has a surface appearance with pores having the average diameter of more than 300 Å, preferably 350 to 1000 Å, in proportion of less than 500 pores/$\mu^2$, preferably up to 350 pores/$\mu^2$, and the dry thickness of 4 to 40 $mg/dm^2$.

In case that the mixed acid is employed as the electrolyte, it is important that the phosphoric acid must be present as the main component, otherwise the printing plate is apt to have the scumming at the time of printing and the printing endurance is also reduced.

Examples of the aluminum or aluminium alloy plate of the invention include a plate of pure aluminum and a plate of aluminum alloy with other metal such as silicon, copper, manganese, magnesium, chromium, zinc, lead, bismuth, nickel, etc. The plate in the form of sheet is preferably used.

The aluminum or aluminium alloy plate is preferably grained before the anodic oxidation treatment by the conventional manner, such as brush (mechanical) graining, chemical graining, electrolytic graining and the like. Furthermore, after the anodic oxidation treatment, it may be optionally hydrophilized.

The aluminum or aluminium alloy plate thus obtained is coated with the photopolymerizable photosensitive composition in dry amount of approximately 10 to 30 $mg/dm^2$ to obtain the photosensitive planographic printing plate of the invention.

The photopolymerizable photosensitive planographic printing plate of the invention may be protected by the conventional technique to prevent the reduction of the sensitivity or storage stability by the oxygen, for instance by providing to the photosensitive layer a detachable transparent cover sheet or a layer of low oxygen permeable waxy material, water soluble or alkali soluble polymer and the like.

The photosensitive planographic printing plate of the invention is then exposed imagewise and developed in a conventional manner to obtain a printing plate.

For the exposure, the widely used light source producing the ultra violet ray or visible ray having the wave length of more than 180 nm, such as carbon arc, high pressure mercury lamp, xenon lamp, metal halide lamp, fluorescent lamp, tangsten lamp, argon ion laser, helium-cadmium laser, krypton laser and the like, may be preferably used.

For the development, a diluted alkaline solution optionally containing preferably up to 10 % by volume of organic solvent may be used. Examples of alkaline compound include inorganic compound such as sodium hydroxide, potassium hydroxide, lithium hydroxide, sodium silicate and sodium bicarbonate, and organic compound such as ammonia, monoethanolamine, diethanolamine and triethanolamine. Preferable examples of water-soluble organic solvent include isopropyl alcohol, benzyl alcohol, ethyl cellosolve, butyl cellosolve, diacetone alcohol and the like. The developing solution may contain a surfactant, dye, salt for inhibiting the swelling or salt for corroding the metal substrate.

According to the invention, a photosensitive planographic printing plate having a high sensitivity, good printing endurance and excellent printability is obtainable, which may be developed by an alkaline developing solution.

The photosensitive planographic printing plate of the invention may be advantageously applicable to the enlarging and projecting exposure process or laser scanning exposure process.

Non-limiting Examples of this invention are given below to illustrate the invention more in detail.

EXAMPLES 1 TO 3 AND COMPARISON EXAMPLE 1 AND 2

A. Preparation of the anodic oxidation layer

An aluminum plate was subjected to the electrolytic graining treatment in a bath containing 17 g/l of hydrochloric acid with a current density of 50 $A/dm^2$ at 25° C. for 25 seconds to obtain a grained plate having a maximum grain of 4$\mu$. The grained plate was then subjected to the anodic oxidation in a bath containing 40 % by weight of phosphoric acid with a current density of 4 $A/dm^2$ at 40° C. for 30 seconds followed by fully washed with water and dried in the air to obtain the aluminum plate having the surface layer of anodic oxidation. The anodic oxidation layer had been found to have pores of 750 Å in average diameter in proportion of 175 pores/$\mu^2$ by the electron microscopic analysis. The aluminum plate thus treated is hereinafter referred to as aluminum plate No. 1.

Other anodically oxidized aluminum plates Nos 2 to 4 were prepared by the same manner except for changing the composition of the electrolytic solution in the anodic oxidation bath as shown in Table 2.

Separately, another aluminum plate was electrolytically grained in the same manner as the aluminum plate No. 1, and subjected to the anodic oxidation in a bath containing 30 % by weight of sulfuric acid at 30° C. for 30 seconds with 6 $A/dm^2$ of the current density to obtain aluminum plate No. 5 for comparison.

The average diameter and the numbers of pores on the surface of the anodic oxidation layer of each aluminum plate are also shown in Table 2.

B. Preparation of the sensitive layer

The anodically oxidized aluminum plates Nos. 1 to 5 were coated with a photosensitive solution obtained by dissolving 9 g of styrene/maleic acid anhydride (partial semi-ester) copolymer ("Stylite CM-2L", M.W.; about 5,000, provided by Sankyo Chemical Industry Co., Ltd.) 1 g of methyl methacrylate/methacrylic acid copolymer synthesized by a conventional method (molar ratio of monomers in the synthesis; 9/1, M.W.; about 50,000) 10 g of trimethylolpropane triacrylate ("Biscoat 295" provided by Osaka Organic Chemical Industry Co, Ltd.), 0.4 g of 2-dibenzoyl-methylene-N-methyl-$\beta$-naphtothiazoline, 0.4 g of 2,4,6-tris(trichloromethyl)-1,3,5-triazine and 0.15 g of Victoria Pure Blue BOH (Hodogaya Chemical Co. Ltd.) in 180 g of ethyl cellosolve, by means of a whirler in dry amount of 20 mg/dm$^2$. Then the surface of each photo-sensitive layer was covered with a protective layer by applying an aqueous solution of polyvinylalcohol in dry amount of 20 mg/dm$^2$ to obtain a photosensitive planographic printing plate.

C. Printing test

Each photosensitive planographic printing plate was exposed by a high pressure mercury lamp of 3 kW (Unipulse UMH-3000, Ushio Electric Co., Ltd ) at the distance of 1m from the light source for 5 seconds, and then developed in a developer of 1% aqueous solution of sodium silicate at room temperature to obtain a press plate. Thus obtained press plates were mounted on a printing machine (Roland RP-1) to effect the printing test. The results of the test are shown in Table 2, illustrating that the printing endurance of the planographic printing plate made from the grained aluminum plate No. 4 and No. 5 was inferior to the others.

grained aluminum plate No. 1 with the photosensitive layer and followingly with the protective layer in the same manner as in Example 1, both layers having the same composition as those of Example 1 (Examples 4 and 5). On the other hand, another photosensitive planographic printing plates were prepared by coating the same aluminum plate No 1 with the photosensitive layer and the protective layer in the same manner as in Example 1, but the photosensitive solution containing 8-hydroxyethyl methacrylate/methyl methacrylate copolymer (weight ratio of monomers in the synthesis; 7/3, molecular weight; about 50,000) synthesized by the conventional manner was used instead of the copolymers of Example 1 (Comparison Examples 3 and 4). From these two kinds of photosensitive planographic printing plates, that is, the one coated with the photosensitive layer containing the copolymer having carboxylic acid (anhydride) residue and the other coated with the photosensitive layer containing the copolymer having no carboxylic acid (anhydride) residue, press plates were made by subjecting to the imagewise exposure in the same way as in Example 1 and followingly to the development with a developer of 1% aqueous solution of sodium silicate (Example 4 and Comparison Example 3) or with a developer of aqueous solution containing 1% benzylalcohol and 0.5% sodium silicate (Example 5 and Comparison Example 4) at room temperature. Thus obtained 4 press plates were subjected to the same printing test as in Example 1. The results of the test are shown in Table 3, illustrating that the photosensitive planographic printing plate obtained by coating the grained aluminium plate anodically oxidized in the phosphoric acid bath with the photopolymerizable photosensitive composition containing the copolymer having no carboxylic acid (anhydride) residue provides the inferior developability and the scumming in the non-imaged area by printing ink at the time of printing, while in the other case of the coating of photopolymerizable photosensitive composition containing the copolymer having carboxylic acid (anhydride) residue according to the invention, the good results were obtained.

TABLE 2

| Example No. | Grained aluminum plate | Composition of anodic oxidation bath | Pores on the surface of anodic oxidation layer | | Developability | Scumming | Printing endurance |
|---|---|---|---|---|---|---|---|
| | | | Average diameter | Number of pores | | | |
| 1 | No. 1 | 40 wt % of phosphoric acid | 750 Å | 175 pores/$\mu^2$ | good | good | 100,000 sheets |
| 2 | No. 2 | 30 wt % of phosphoric acid, 2.5 wt % of sulfuric acid | 500 Å | 220 pores/$\mu^2$ | good | good | 100,000 sheets |
| 3 | No. 3 | 30 wt % of phosphoric acid, 5 wt % of sulfuric acid | 350 Å | 350 pores/$\mu^2$ | good | good | 80,000 sheets |
| Comparison Example 1 | No. 4 | 30 wt % of phosphoric acid, 30 wt % of surfuric acid | 250 Å | 1000 pores/$\mu^2$ | good | good | 30,000 sheets |
| Comparison Example 2 | No. 5 | 30 wt % of sulfuric acid | 130 Å | more than 1000 pores/$\mu^2$ | good | good | 10,000 sheets |

EXAMPLES 4 AND 5 AND COMPARISON EXAMPLES 3 and 4

Photosensitive planographic printing plates were prepared by coating the anodically oxidized and

TABLE 3

| Copolymer | Example 4 Having carboxylic acid (anhydride) residue | Example 5 | Comparison Example 3 Having no carboxylic acid (anhydride) residue | Comparison Example 4 |
|---|---|---|---|---|
| Developer | 1% of | 1% of | 1% of | 1% of |

TABLE 3-continued

| Copolymer | Example 4 | Example 5 | Comparison Example 3 | Comparison Example 4 |
|---|---|---|---|---|
| | Having carboxylic acid (anhydride) residue | | Having no carboxylic acid (anhydride) residue | |
| | sodium silicate | benzyl alcohol, 0.5% of sodium silicate | sodium silicate | benzyl alcohol, 0.5% of sodium silicate |
| Developability | good | good | bad | good |
| Scumming | good | good | bad | slightly bad |
| Printing endurance | 100,000 sheets | 100,000 sheets | — | — |

COMPARISON EXAMPLES 5 TO 8

Two kinds of photosensitive planographic printing plates were prepared in the same manner as in Example 4 and Comparison Example 3 except that the anodically oxidized and grained aluminum plate No. 5 was used. As the photosensitivity of each plate was reduced under the conditions of the imagewise exposure in Example 1 the exposing time was prolonged to 10 seconds. After the development in the same way as in Examples 4 and 5 and Comparison Examples 3 and 4, press plates were obtained. Then, they were subjected to the printing test. The results are shown in table 4, illustrating that the grained aluminium plates which were treated by the anodic oxidation in the sulfuric acid bath can partially improve the developability and the scumming at printing when the photosensitive material of copolymer having no carboxylic acid (anhydride) residue was coated, but the printing endurance of all press plates is not acceptable.

TABLE 4

| Copolymer | Comparison Example 5 | Comparison Example 6 | Comparison Example 7 | Comparison Example 8 |
|---|---|---|---|---|
| | Having carboxylic acid (anhydride) residue | | Having no carboxylic acid (anhydride) residue | |
| Developer | 1% of sodium silicate | 1% of benzyl alcohol, 0.5% of sodium silicate | 1% of sodium silicate | 1% of benzyl alcohol, 0.5% of sodium silicate |
| Developability | good | good | bad | good |
| Scumming | good | good | bad | good |
| Printing endurance | bad | bad | — | bad |

EXAMPLE 6 AND COMPARISON EXAMPLE 9

A photosensitive solution was prepared by repeating Example 1, but the copolymers were displaced with hydroxyphenylmethacrylamide/acrylonitrile/ethyl acrylate/methacrylic acid copolymer (molar ratio of monomers in the synthesis; 8/24/60/8, molecular weight about 60,000) synthesized by the conventional method. The anodically oxidized and grained aluminum plate No. 3 was coated with the photosensitive solution obtained above, and further covered with the protective layer to obtain a photopolymerizable photosensitive planographic printing plate. The planographic printing plate thus obtained was closely contacted with an image-bearing original film in vacuum, and exposed by a high pressure mercury lamp with 10 mJ/cm$^2$, and developed by a developer containing 2% of benzyl alcohol and 1% of sodium silicate at room temperature. The unexposed area of the photosensitive layer was completely dissolved and removed and a clear image was formed. Thereafter the printing plate was subjected to the printing machine to obtain 50 000 sheets of good printed matter without scumming in the non-imaged area (Example 6).

A cyclohexanone solution containing 4% by weight of photosensitive polyester obtained by condensing 1.0 mole of p-phenylenediacrylic acid, 0.35 moles of hydrized bis-phenol A and 0.65 moles of triethyleneglycol in the conventional manner was added with 2-dibenzoylmethylene-N-methyl-$\beta$-naphtothiazoline and phthalocyanine dye by the amount of 5% by weight and 15% by weight, respectively, of the polyester to prepare another photosensitive solution. The aluminum plate No. 3 was coated with this photosensitive solution in amount of 10 to 12 mg/dm$^2$ to prepare a photodimerizable photosensitive planographic printing plate. The plate was then subjected to the imagewise exposure and development as in Example 6, but the intense exposure of 150 mJ/cm$^2$ was required to form the clear image as Example 6 (Comparison Example 9).

EXAMPLE 7

A photosensitive solution was prepared by repeating Example 1, but the copolymers were displaced with methyl methacrylate/methacrylic acid copolymer (molar ratio; 7/3, molecular weight; about 35,000) synthesized according to the conventional method. The anodically oxidized and grained aluminum plate No. 2 was coated with the photosensitive solution above and covered with the protective layer to prepare a photopolymerizable photosensitive planographic printing plate.

The planographic printing plate was exposed through an image-bearing micro film while enlarging and projecting the image in 5 times by an enlarging and projecting composer ("SAPP System", Dainippon Screen Mfg Co.,Ltd) for 5 seconds and then developed by a developer containing 4.5% by weight of butyl cellosolve and 2.5% by weight of sodium silicate at room temperature.

The unexposed area was fully dissolved and removed, and a clear image was formed After subjecting to the printing machine good printed matters of 100,000 sheets were printed off without contamination in the non-imaged area.

EXAMPLE 8

A sensitized solution was prepared by dissolving 5 g of multifunctional addition polymerizable copolymer (molecular weight; about 7,000) obtained by semi-esterification of acid anhydride residue of styrene/maleic acid anhydride (partial semi-ester) copolymer with pentaerythritol triacrylate, 4 g of styrene/maleic acid anhydride (partial semi-ester) copolymer (described in Example 1), 1 g of methyl methacrylate/methacrylic acid copolymer (described in Example 1), 10 g of trimethyrol-propane triacrylate (described in Example 1), 0.2 g of 2-(dimethylaminophenyl)-benzoxazole 0.6 g of 2-mercaptobenzothiazole, 2 g of 2,2'-bis-(2-chlorophenyl)-4,4',5,5'-tetraphenylbiimidazole and 0.15 g of Victoria Pure Blue BOH in 180 g of ethyl cellosolve. The aluminum plate No. 1 was coated with the sensitive solution and then covered with the protective layer to prepare a photopolymerizable photosensitive planographic printing plate.

The planographic printing plate was exposed in the manner of laser scanning of 1024 lines/inch in scanning density by means of a laser processing device (EOCOM LASERITE-V) mounting an argon ultra violet laser tube having maximum power of 3 W, and developed by the same way as in Example 1. A clear image was formed on the printing plate even by reducing the laser power to 0.05 W and the exposing time of 1.5 min/0.25m².

The printing plate was then mounted on a news-printing rotary offset press and the printing was effected under the usual conditions for printing news paper. Good printed matters of 100,000 sheets were printed off.

What is claimed is:

1. A photosensitive planographic printing plate, comprising:
  (A) an aluminum or aluminum alloy plate having an anodic oxidation layer 4 to 40 mg/dm² in dry thickness which has pores of a size of from 350 to 1000Å in average diameter in an amount of less than 350 pores/μ², said layer being obtained by anodic oxidation in an electrolyte of phosphoric acid or in an electrolyte containing not less than 10 wt.% phosphoric acid; and
  (B) a layer of a photopolymerizable photosensitive composition overlaid on the aluminum or aluminum alloy plate and comprised of 1) 20 to 60% by weight of a polymer having a molecular weight ranging from 1,000 to 100,000 and having pendant residues consisting of carboxylic acid residues or carboxylic acid anhydride residue constituted by units represented by the following formulae I to IV

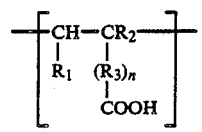

I

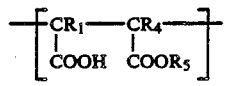

II

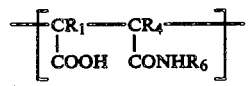

III

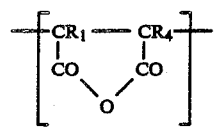

IV wherein $R_1$ and $R_4$ are hydrogen or alkyl, $R_2$ is hydrogen, methyl, alkylcarbamoyl, or arylcarbamoyl, $R_3$ is alkylene of 1 to 7 carbon atoms, optionally substituted with phenylene or hydroxyl, $R_5$ is hydrogen or optionally substituted alkyl, aryl or cycloalkyl, $R_6$ is optionally substituted alkyl, aryl, or cycloalkyl and n is an integer of 0 to 1, 2) 80 to 40% by weight of an additional polymerizable unsaturated compound and 3) 1 to 10% by weight of a photopolymerization initiator.

2. The photosensitive planographic printing plate according to claim 1, wherein said electrolyte is an electrolyte solution containing 10 to 50% by weight phosphoric acid and optionally up to 25% by weight of another acid.

3. The photosensitive planographic printing plate according to claim 1 or 2, wherein the units constituting the polymer are selected from the group consisting of acrylic acid, methacrylic acid, maleic anhydride and maleic acid monoalkyl ester.

* * * * *